(12) United States Patent
Castagna et al.

(10) Patent No.: US 9,007,844 B2
(45) Date of Patent: Apr. 14, 2015

(54) CONTROL SYSTEM FOR MEMORY DEVICE

(75) Inventors: Giuseppe Castagna, Palermo (IT); Vincenzo Matranga, Palermo (IT); Maurizio Francesco Perroni, Furnari (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 186 days.

(21) Appl. No.: 13/532,994

(22) Filed: Jun. 26, 2012

(65) Prior Publication Data

US 2013/0003462 A1  Jan. 3, 2013

(30) Foreign Application Priority Data

Jun. 29, 2011  (IT) .............................. MI2011A1201

(51) Int. Cl.
G11C 16/06 (2006.01)
G11C 5/14 (2006.01)
G11C 16/30 (2006.01)

(52) U.S. Cl.
CPC . *G11C 5/14* (2013.01); *G11C 16/30* (2013.01)

(58) Field of Classification Search
None
See application file for complete search history.

(56) References Cited

U.S. PATENT DOCUMENTS

| | | |
|---|---|---|
| 5,291,446 A | 3/1994 | Van Buskirk et al. |
| 6,856,556 B1 | 2/2005 | Hajeck |
| 2004/0001359 A1 | 1/2004 | Ott |
| 2007/0274132 A1* | 11/2007 | Ogiwara et al. ......... 365/185.23 |
| 2010/0265785 A1 | 10/2010 | Lee et al. |
| 2011/0141839 A1 | 6/2011 | Won |

* cited by examiner

*Primary Examiner* — James G Norman
(74) *Attorney, Agent, or Firm* — Allen, Dyer, Doppelt, Milbrath & Gilchrist, P.A.

(57) ABSTRACT

A nonvolatile memory device includes a discharge circuit configured to selectively connect circuit nodes to discharge terminals through corresponding discharge paths, and an accumulation device for accumulating electric charge. A driving circuit is for driving the discharge circuit in such a way to connect at least a part of such circuit nodes to the discharge terminals if the value of the external supply voltage falls below a corresponding threshold. A supply circuit is for supplying the driving circuit with an intermediate supply voltage. Each one of the intermediate supply voltages is the corresponding external supply voltage when the value of the external supply voltage is higher than the corresponding threshold, or it is an internal voltage locally generated by the supply circuit by exploiting the electric charge stored by the accumulation device when the value of the external supply voltage is lower than the corresponding threshold.

16 Claims, 3 Drawing Sheets

CONTROL SYSTEM FOR MEMORY DEVICE

FIELD OF THE INVENTION

The present invention relates to electronic devices and, more particularly, to a control system for a nonvolatile memory device.

BACKGROUND OF THE INVENTION

An important issue relating to nonvolatile memory devices, such as flash memory devices, regards the managing of internal circuit nodes of the memory devices in the periods subsequent to the occurrence of a sudden interruption in the supply voltage, for example, caused by a malfunctioning of the supply source. Typically, as soon as the supply voltage of a memory device becomes zero, all the signals driving and/or biasing the components of the memory device run out. As a consequence, the internal circuit nodes in turn lose bias, and discharge because of the "leakage effect". The time spent by such nodes for completely discharging cannot be quantified beforehand, being based on the values of the sub-threshold currents of the transistors and on the conductivity of the discharge paths, which are parameters that strongly depend on the tolerances of the manufacturing process employed for producing the device.

If the supply voltage becomes zero while the memory device is carrying out an operation, such operation is interrupted, jeopardizing the correct outcome thereof. Moreover, if the operation interrupted by the extinction of the supply voltage involved the use of high voltages, for example programming or erasing voltages obtained by increasing the supply voltage through booster circuits such as charge pumps, the uncontrolled discharge from the leakage effect of the circuit nodes biased to such high voltages may cause the occurrence of irreversible structural damage in the memory device, compromising the correct operation thereof.

With, for example, reference to a modern memory flash device, during an erasing operation, and particularly during the generation of the erasing pulse, very high voltage differences are generated, for example on the order of 18 Volts. Furthermore, the wordlines of the memory sector subjected to erasing are biased with a high (in absolute value) negative voltage, for example −9 Volts, while the circuit nodes corresponding to the source regions, to the wells and to the buried layers are biased with a high positive voltage, for example 9 Volts. A standard erasing operation provides that, after the provision of the erasing pulse, the wordlines and the nodes corresponding to the source regions, the wells and the buried layer, are discharged to the reference voltage (ground) via two parallel discharge paths, one for the negative voltages and one for the positive voltages. If during the provision of the erasing pulse the supply voltage becomes zero, all of the circuits dedicated to the wordline discharge process and the above-mentioned circuit nodes are not supplied anymore, with the result being that both the wordlines and such circuit nodes are left into a floating condition at high voltages compared to the ground voltage. The uncontrolled discharge from the leakage effect of such floating nodes may thus cause the occurrence of irreversible structural damages.

SUMMARY OF THE INVENTION

An object is to provide a memory device that is not affected by the abovementioned drawbacks from the loss of the external supply voltages.

According to an embodiment, a nonvolatile memory device integrated in a semiconductor material chip is provided. The memory device is supplied via at least one external supply voltage received from outside of the chip. The memory device comprises a discharge circuit configured to selectively connect circuit nodes of the memory device to discharge terminals through corresponding discharge paths, and an accumulation device for accumulating electric charge. The memory device further comprises a driving circuit for driving the discharge circuit in such a way as to connect at least a part of such circuit nodes to the discharge terminals if the value of the at least one external supply voltage falls below a corresponding threshold, and a supply circuit for supplying the driving circuit with an intermediate supply voltage for each external supply voltage. Each one of the intermediate supply voltages is the corresponding external supply voltage when the value of the external supply voltage is higher than the corresponding threshold, or it is an internal voltage locally generated by the supply circuit by exploiting the electric charge stored by the accumulation device when the value of the external supply voltage is lower than the corresponding threshold.

A further aspect of the present invention involves a corresponding method for operating a nonvolatile memory device.

DETAILED DESCRIPTION OF THE PREFERRED EMBODIMENTS

Figure 1:
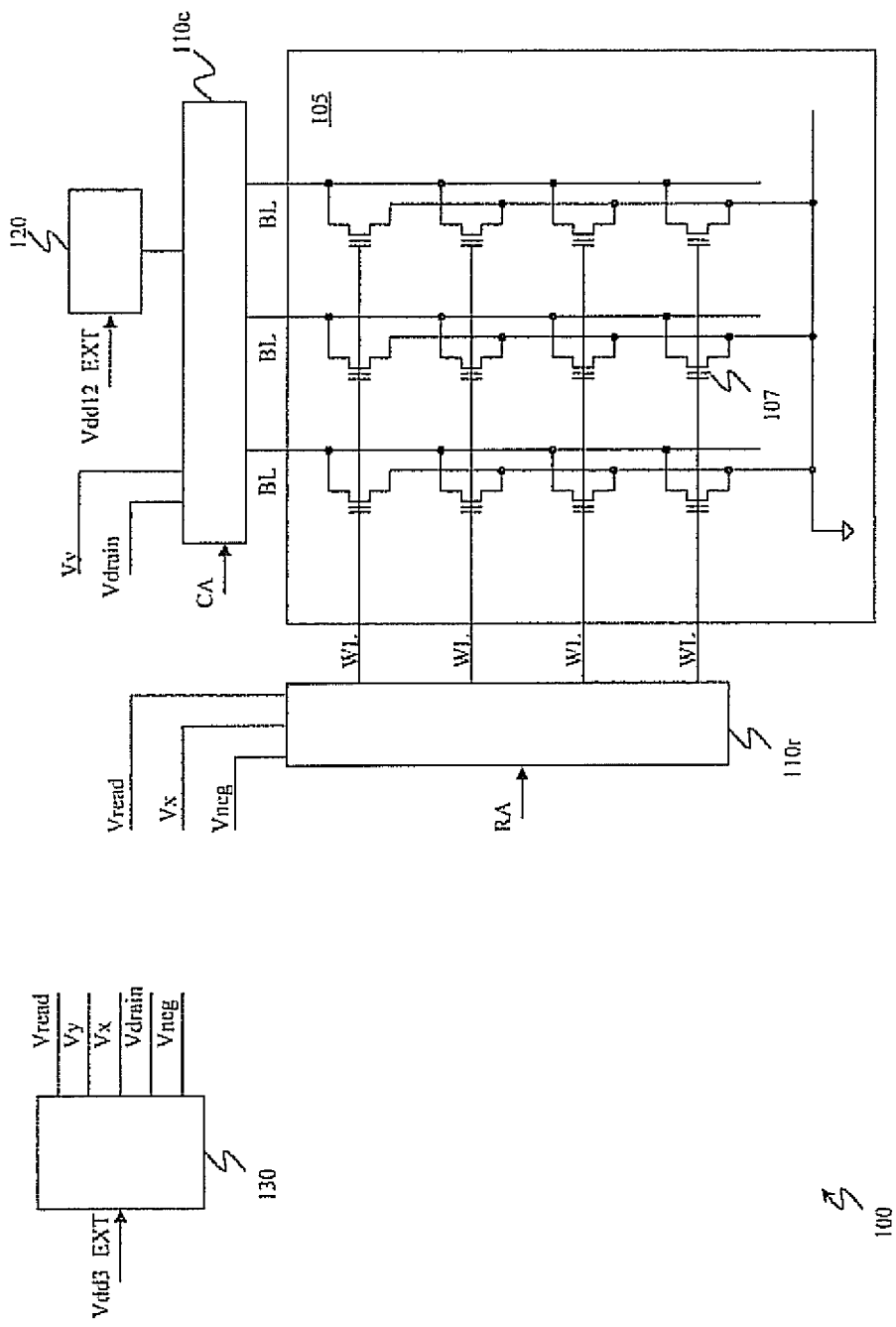
FIG. 1 is a schematic diagram illustrating a portion of a nonvolatile memory device.

Making reference in particular to FIG. 1, there is schematically illustrated a portion of an example nonvolatile memory device 100, particularly a memory device of the flash type (hereinafter simply referred to as "flash memory"). The flash memory 100 is integrated in a semiconductor material chip; a matrix 105 of memory cells 107—particularly, a matrix having a NOR architecture, as illustrated in FIG. 1—is used to store data.

Each memory cell 107 includes a floating gate MOS transistor. The memory cell 107, in an unprogrammed (or erased) condition exhibits a relatively low threshold voltage. The memory cell 107 is programmed by injecting electric charge into the respective floating gate. In this condition, the memory cell 107 exhibits a relatively high threshold voltage. The value of the threshold voltage defines the different logic values the data stored in the memory cell 107 may assume. The memory cell 107 is erased by removing the electric charge stored in the respective floating gate.

The cells 107 are arranged in rows and columns. The matrix 105 includes a wordline WL for each row and a bitline BL for each column. The memory cell 107 belonging to a generic row and to a generic column has the gate terminal connected to the wordline WL associated to such row, the drain terminal connected to the bitline BL associated to such column, and the source terminal connected to a common source line for receiving the ground voltage.

During a programming or reading operation, a group of memory cells 107 belonging to a same row are selected at the same time to be programmed/read.

The row selection is carried out via a row selector circuit 110r, which receives at its inputs a row address RA, decodes it, and selects a corresponding row of the matrix. Particularly, during a reading operation the row selector circuit 110r biases at a reading voltage Vread (for example, equal to about 4, 2 Volts) the wordline WL corresponding to the selected cells 107, while the other wordlines WL are biased to a deselection voltage, such as the ground voltage. During a programming operation the row selector circuit 110r provides to the corresponding wordline WL a programming voltage ramp Vx (for example, starting from a value equal to the ground until a value of 8, 5 Volts), while the other wordlines WL are biased at the deselection voltage.

The column selection is carried out via a column selector circuit 110c, which receives at its inputs a column address CA, decodes it, and selects a corresponding group of rows of the matrix. Particularly, the column selector circuit 110c connects—via column decoding circuits properly biased with a decoding voltage Vy—the bitlines BL corresponding to the selected memory cells 107 to a reading/writing circuit 120, while the remaining bitlines BL are kept floating at the deselection voltage. During a reading operation, the reading/writing circuit 120 biases the bitlines BL selected by the column decoding circuit 110c to a reading biasing voltage (for example, equal to 0, 7 Volt). During a programming operation, the column selector circuit 110c biases the selected bitlines BL to a bias voltage Vdrain (for example equal to 4, 2 Volts).

During an erasing operation, a group of memory cells 107 corresponding to a memory sector is erased by biasing the wordlines WL corresponding to the sector to be erased to a (negative) erasing voltage Vneg (for example, equal to −9 Volts), while the bitlines BL corresponding to the sector to be erased are kept floating.

The flash memory 100 includes a boosting section 130 configured to receive from the outside of the device an external supply voltage Vdd3_EXT (for example equal to 5 Volts) and use such voltage for generating, through proper charge pumps, the voltages Vread, Vy, Vx, Vdrain and Vneg.

As already mentioned above, if the external supply voltage Vdd3_EXT becomes zero, the circuit nodes of the flash memory 100 discharge in an uncontrolled way from the leakage effect. If the external voltage supply Vdd3_EXT become zero during a programming or erasing operation, both involving the use of high voltages, the uncontrolled discharge for the leakage effect of the circuit nodes biased to such high voltages (hereinafter simply referred to as "critical circuit nodes") may cause the beginning of irreversible structural damage.

The logic and control sections (not illustrated) of the flash memory 100, such as, for example, the arrays of address latches and the sequential logic of the memory microcontroller, as well as the reading/writing circuit 120, are also supplied by a further external supply voltage Vdd12_EXT received from the outside, of a lower value (for example, equal to 1, 2 Volts) compared to the value of the external supply voltage Vdd3_EXT.

If the external supply voltage Vdd12_EXT becomes zero, the data and the information managed by the logic and control sections are lost. Moreover, the programming and/or reading operations which were in progress during the loss of the external supply voltage Vdd12_EXT abruptly interrupt, since the reading/writing circuit 120 is no longer supplied.

According to an embodiment, the discharge of the critical circuit nodes of the flash memory 100 following the loss of the external power supplies is carried out in a controlled way via a control circuit supplied by internal supply voltages generated and exploiting the electric charge stored during the normal operation of the device in circuit nodes having an associated capacity which is relatively high.

Figure 2:
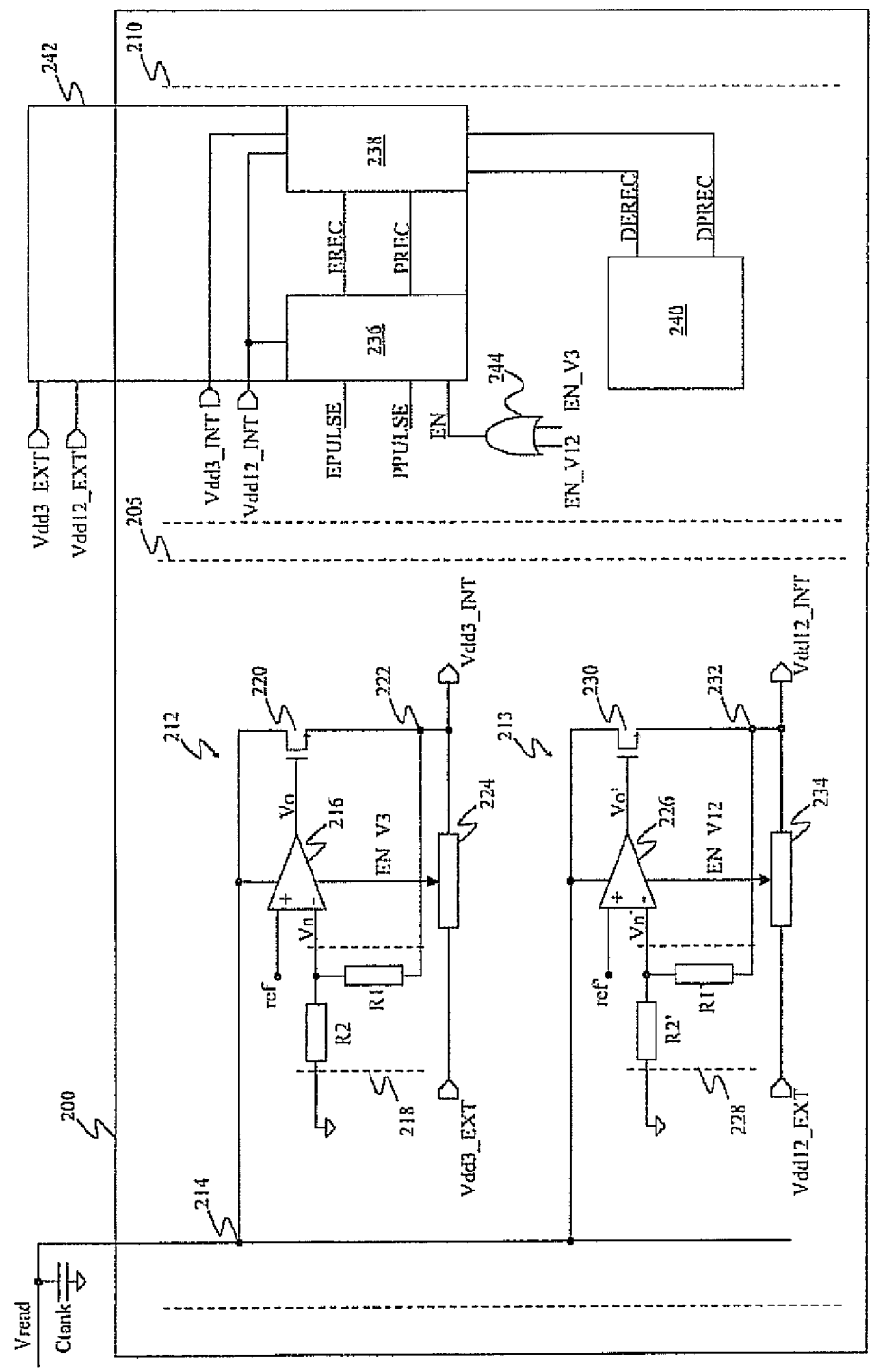
FIG. 2 is a schematic diagram illustrating a control circuit of the memory device of FIG. 1 according to an embodiment.

Such control circuit according to an embodiment is illustrated in FIG. 2 with the reference 200. The control circuit 200 comprises two main sections, and particularly a supplying section 205 configured to generate internal supply voltages, and a driving section 210—supplied by the supplying section 205—configured to discharge the critical circuit nodes of the flash memory 100.

According to an embodiment, the supplying section 205 comprises a subsection for each external supply voltage. Each subsection is configured to generate an internal supply voltage, which will substitute the corresponding external supply voltage during the node discharging operations. In the considered example, wherein the flash memory 100 is supplied via two external supply voltages Vdd3_EXT, Vdd12_EXT, the supplying section 205 comprises a first subsection 212 receiving the external supply voltage Vdd3_EXT and generating a corresponding internal supply voltage Vdd3_INT, and a second subsection 213 receiving the external supply voltage Vdd12_EXT and generating a corresponding internal supply voltage Vdd12_INT.

According to an embodiment, at the loss of the external supply voltages, the internal supply voltages are generated by the supplying section 205 using the electric charge stored in the capacity associated with the circuit node of the boosting section 130 dedicated to the provision of the reading voltage Vread. In fact, a high amount of electric charge is accumulated at this node, since it is endowed with an associated capacity that is relatively high (of the order of the nF). The high capacity of such node is from both the presence of the high capacitive load resulting from the internal circuitry of the matrix of memory cells and the presence of ballast capacitors for the reduction of the unavoidable voltage ripples at the wordlines WL during the reading operations. The whole capacity that is associated to the circuit node of the boosting circuit 130 providing the reading voltage Vread (circuit node 214) is illustrated in FIG. 2 via a capacitor Ctank.

The subsection 212 comprises a first input terminal coupled to the node 214, a second input terminal for receiving the external supply voltage Vdd3_EXT, and an output terminal for providing the internal supply voltage Vdd3_INT. The subsection 212 comprises an operational amplifier 216 having a non-inverting input terminal receiving a reference voltage ref, an inverting input terminal connected to a feedback network 218 for receiving a voltage Vn, a first output terminal adapted to provide an analog output terminal Vo that is proportional to the difference between the voltage at the non-inverting terminal and the voltage at the inverting terminal (when the operational amplifier operates in the linear region), and a second output terminal adapted to provide a (digital) enabling signal EN_V3 adapted to assume a high logic value ("1") when the voltage at the non-inverting input terminal is higher than the voltage at the inverting input terminal and a low logic value ("0") when the voltage at the non-inverting input terminal is lower than the voltage at the inverting input terminal. The operational amplifier 216 has a supply terminal connected to the node 214; in this way, the operational amplifier 216 is supplied by the voltage generated via the electric charge stored in the capacitor Ctank.

The first output terminal of the operational amplifier 216 is connected to a gate terminal of a regulation transistor 220, for example an n-channel MOS transistor. The regulation transistor 220 has a drain terminal connected to the node 214, and a source terminal connected to the feedback network 218 (circuit node 222).

The feedback network 218 comprises a first resistor R1 and a second resistor R2. Specifically, the resistor R1 has a first terminal connected to the inverting input terminal of the operational amplifier 216, and a second terminal connected to the node 222. The resistor R2 has a first terminal connected to the inverting input terminal of the operational amplifier 216 and a second terminal connected to a terminal providing the ground voltage.

The subsection 212 further comprises a decoupling circuit 224, having an input terminal connected to the second input terminal of the subsection 212 for receiving the external supply voltage Vdd3_EXT, an output terminal for providing the internal supply voltage Vdd3_INT to the output terminal of the subsection 212, and a control terminal coupled to the second output terminal of the operational amplifier for receiving the enabling signal EN_V3. The decoupling circuit 224 is configured to couple/decouple the input terminal to/from the output terminal based on the value assumed by the enabling signal EN_V3. Specifically, when the enabling signal EN_V3 is at the low logic value, the input terminal is coupled to the output terminal, in such a way that the internal supply voltage Vdd3_INT is equal to the external supply voltage Vdd3_EXT. When instead the enabling signal EN_V3 is at the high logic value, the input terminal is decoupled from the output terminal, and the internal input voltage Vdd3_INT is generated by the subsection 212 regardless of the external supply voltage Vdd3_EXT. The subsection 213 is structurally similar to the subsection 212.

Particularly, the subsection 213 comprises a first input terminal coupled to the node 214, a second input terminal for receiving the external supply voltage Vdd12_EXT, and an output terminal for providing the internal supply voltage Vdd12_INT. The subsection 213 comprises an operational amplifier 226 having a non-inverting input terminal receiving a reference voltage ref', an inverting input terminal connected to a feedback network 228 for receiving a voltage Vn', a first output terminal adapted to provide an analog output terminal Vo' that is proportional to the difference between the voltage at the non-inverting terminal and the voltage at the inverting terminal (when the operational amplifier operates in the linear region), and a second output terminal adapted to provide a (digital) enabling signal EN_V12 adapted to assume a high logic value ("1") when the voltage at the non-inverting input terminal is higher than the voltage at the inverting input terminal and a low logic value ("0") when the voltage at the non-inverting input terminal is lower than the voltage at the inverting input terminal. The operational amplifier 226 has a supply terminal connected to the node 214. In this way, the operational amplifier 226 is supplied by the voltage generated thanks to the electric charge stored in the capacitor Ctank.

The first output terminal of the operational amplifier 226 is connected to a gate terminal of a regulation transistor 230, for example an n-channel MOS transistor. The regulation transistor 230 has a drain terminal connected to the node 214, and a source terminal connected to the feedback network 22B (circuit node 232).

The feedback network 228 comprises a first resistor R1' and a second resistor R2'. Specifically, the resistor R1' has a first terminal connected to the inverting input of the operational amplifier 226, and a second terminal connected to the node 232. The resistor R2' has a first terminal connected to the inverting input terminal of the operational amplifier 226 and a second terminal connected to a terminal providing the ground voltage.

The subsection 213 further comprises a decoupling circuit 234, having an input terminal connected to the second input terminal of the subsection 213 for receiving the external supply voltage Vdd12_EXT, an output terminal for providing the internal supply voltage Vdd12_INT to the output terminal of the subsection 213, and a control terminal coupled to the second output terminal of the operational amplifier for receiving the enabling signal EN_V12. The decoupling circuit 234 is configured to couple/decouple the input terminal to/from the output terminal based on the value assumed by the enabling signal EN_V12. Specifically, when the enabling signal EN_V12 is at the low logic value, the input terminal is coupled to the output terminal, in such a way that the internal supply voltage Vdd12_INT is equal to the external supply voltage Vdd12_EXT. When instead the enabling signal EN_V12 is at the high logic value, the input terminal is decoupled from the output terminal, and the internal input voltage Vdd12_INT is generated by the subsection 213 regardless of the external supply voltage Vdd12_EXT.

The driving section 210 of the control circuit 210 comprises three main logic subsections, and particularly an identification subsection 236, a driving subsection 238 and an actuating subsection 240. According to an embodiment, the identification subsection 236 and the driving subsection 238 belong to a logic and control section of the flash memory 100, identified with the reference 242 and normally supplied via the external supply voltages Vdd3_EXT, Vdd12_EXT. Similar considerations apply in case one or both the abovementioned subsections are implemented separately, and do not belong to the section 242.

The identification subsection 236 has the purpose of identifying the operation the flash memory 100 was carrying out when the external supply voltages Vdd3_EXT, Vdd12_EXT expired. Knowing the exact type of the operation interrupted by the extinction of the external supply voltages is important, since each type of operation involves a different set of critical nodes. For example, in a programming operation, and particularly during the provision of a programming pulse, the critical nodes to be discharged in a controlled way are those defined by the bitlines BL and the wordlines WL, while in an erasing operation, and particularly during the application of an erasing pulse, the critical nodes are those corresponding to the wordlines WL, the wells and the buried layers.

The identification subsection 236 has a first input terminal configured to receive a first pulse indicative signal EPULSE, and a second input terminal configured to receive a second pulse indicative signal PPULSE. The pulse indicative signal EPULSE is a signal that allows to identify when an erasing pulse is applied. For example, the pulse indicative pulse EPULSE is a digital signal, which assumes the high logic value only during the provision of an erasing pulse, while it is at the low logic value otherwise. Similarly, the pulse indicative signal PPULSE is a signal that allows to identify when a programming pulse is supplied. For example, the pulse indicative signal PPULSE is a digital signal, which assumes the high logic value only during the provision of a programming pulse, while it is at the low logic value otherwise. The signals EPULSE and PPULSE are for example generated by a state machine (not illustrated) of the flash memory 100.

The identification subsection 236 further comprises a third input terminal coupled to the output terminal of an OR logic gate 244 for receiving an enabling signal EN. The logic gate 244 has a first input terminal receiving the enabling signal EN_V12 and a second input terminal receiving the enabling signal EN_V3. The identification subsection 236 has two output terminals, and particularly a first output terminal adapted to provide a first (digital) recovery signal EREC and a second output terminal adapted to provide a second (digital) recovery signal PREC.

The identification subsection 236 is configured to assert—for example, to the high logic value—the recovery signal EREC when the enabling signal EN is at the high value (i.e., when at least one among the enabling signal EN_V12 and the enabling signal EN_V3 is at the high logic value) and at the same time the pulse identification signal EPULSE is at the high logic value. Similarly, the identification subsection 236 is configured to assert—for example, at the high logic value—the recovery signal PREC when the enabling signal EN is at the high logic value (i.e., when at least one among the enabling signal EN_V12 and the enabling signal EN_V3 is at the high logic value) and at the same time the pulse identification signal PPULSE is at the high logic value.

The identification subsection 236 includes electronic devices of the "low voltage" type, adapted to sustain relatively reduced voltage differences, and it is supplied via the internal supply voltage Vdd12_INT. Consequently, the digital recovery signals EREC and PREC may assume a first value (for example, associated with the low logic value) corresponding to the ground voltage and a second value (for example, associated with the high logic value) corresponding to the internal supply voltage Vdd12_INT.

The driving subsection 238, implemented with electronic devices of the "high voltage" type, i.e., adapted to sustain relatively high voltage differences, and supplied both via the internal supply voltage Vdd12_INT and the internal supply voltage Vdd3_INT, has a first input terminal for receiving the recovery signal EREC and a second input terminal for receiving the recovery signal PREC. The driving subsection 238 comprises level shifter circuits (not illustrated) adapted to generate driving signals DEREC, DPREC starting from the recovery signals EREC, PREC, respectively. Particularly, if the recovery signal EREC is at the first value, corresponding to the ground voltage, the driving signal DEREC is driven as well to the ground voltage. If instead the recovery signal EREC is at the second value, corresponding to the internal supply voltage Vdd12_INT, the driving signal DEREC is driven to the internal supply voltage Vdd3_INT. In the same way, if the recovery signal PREC is at the first value, corresponding to the ground voltage, the driving signal DPREC is driven as well to the ground voltage. If instead the recovery signal PREC is at the second value, corresponding to the internal supply voltage Vdd12_INT, the driving signal DPREC is driven to the internal supply voltage Vdd3_INT.

The driving signals DEREC and DPREC are thus provided to the actuating subsection 240, implemented as well via devices of the high voltage type. Without entering into details that may be outside of the purpose of the present description, and that are well known to the skilled artisan, the actuating subsection 240 is formed by switch circuits connected between the critical nodes of the flash memory 100 and proper discharge paths toward reference terminals at the ground voltage.

When both the driving signals DEREC and DPREC are deasserted (for example to the low logic value), all the switch circuits are opened. When the signal DEREC is asserted, it means that the external supply voltage have been extinguished during an erasing operation. As a consequence, the switch circuits coupled to the critical nodes corresponding to the erasing operation are driven to close, in such a way to allow the discharge of such nodes through the corresponding discharge paths.

When the signal DPREC is asserted, it means that the external supply voltage have been extinguished during a programming operation. As a consequence, the switch circuits coupled to the critical nodes corresponding to the programming operation are driven to close, in such a way to allow the discharge of such nodes through the corresponding discharge paths.

Figure 3:
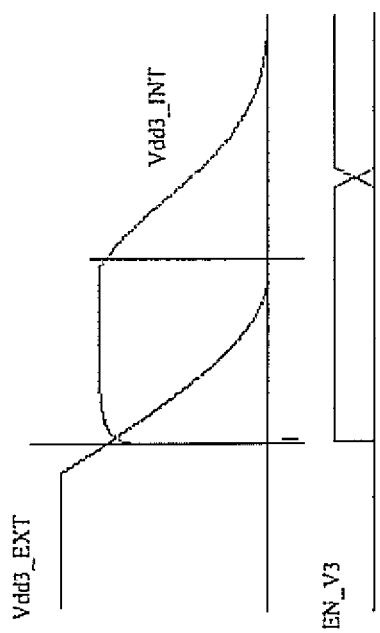
FIG. 3 is a timing diagram illustrating an example time trend of some signals and voltages managed/generated by the control circuit of FIG. 2.

The operation of the control circuit 200 according to an embodiment will be now described making reference to FIG. 2 together with FIG. 3, which illustrates an exemplificative time trend of the external supply voltage Vdd3_EXT, the internal supply voltage Vdd3_INT and the enabling signal EN_V3.

In the initial situation, the external supply voltage Vdd3_EXT received by the flash memory 100 is at the expected value (for example, 5 Volts), and the flash memory 100 operates in a standard manner. In this situation, the decoupling circuit 224 of the subsection 212 of the supplying section 205 is closed, and the internal supply voltage Vdd3_INT is set to the external supply voltage Vdd3_EXT. The voltage Vn at the inverting terminal of the operational amplifier 216 is equal to (Vdd3_INT)*(R2/(R1+R2))= (Vdd3_EXT)*(R2/(R1+R2)), where R1 and R2 are the resistance values of the resistors R1, R2, respectively. The reference voltage ref is set to a (fixed) value lower than the value assumed by the voltage Vn during the standard operation of the flash memory 100, i.e., when external supply voltage Vdd3_EXT is at the expected value. As long as the value of the external supply voltage Vdd3_EXT is higher than the threshold TH=(ref)*((R1+R2)/R2), the output signal Vo is at the lower saturation level of the operational amplifier 216 (the ground voltage), and the regulation transistor 220 results to be turned off. Therefore, the operational amplifier 216 results to be in an open loop condition, wherein the voltage difference between the inverting terminal and the non-inverting one is not compensated. Moreover, as long as the condition is maintained, the enabling signal EN_V3 results to be at the low logic value (for example, at the ground voltage), keeping closed the decoupling circuit 224. Since the decoupling circuit is closed, every variation in the external supply voltage Vdd3_EXT entirely reflects on the internal supply voltage Vdd3_INT.

When the value of the external supply voltage Vdd3_EXT falls below the threshold TH=(ref)*((R1+R2)/R2), for example because of a malfunctioning or a loss of the supply source, the voltage Vn at the inverting terminal of the operational amplifier 216 becomes lower than the reference voltage ref at the non inverting terminal. The enabling signal EN_V3 switches thus to the high logic value, opening the decoupling circuit 224. Particularly, the input terminal of the decoupling circuit 224 is decoupled from the output terminal, and the internal supply voltage Vdd3_INT is generated by the subsection 212 regardless of the external supply voltage Vdd3_EXT.

Specifically, in this condition (ref>Vn) the output signal Vo of the operational amplifier 216 increases, until the regulation transistor 220 is activated. Due to the activation of the regulation transistor 220, a feedback loop is established, so that the operational amplifier 216 acts in such a way to bring—and maintain—the value of the voltage Vn to the value of the reference voltage ref. As a consequence, the internal supply voltage Vdd3_INT is brought to the threshold voltage TH= (ref)*((R1+R2)/R2). The internal supply voltage Vdd3_INT is kept at the threshold voltage TH by the electric charge the regulation transistor 220 takes from the capacitor Ctank.

The switching of the enabling signal EN_V3 to the high logic value involves a consequent switching of the enabling signal EN, signaling in this way to the driving signal 210 (which is now supplied via the internal supply voltage Vdd3_INT generated by the supplying section 205) that at least one of the external voltages has become zero.

If the external voltage Vdd3_EXT becomes zero during the provision of an erasing pulse (pulse indicative signal EPULSE at the high logic value), the identification subsection 236 asserts the recovery signal EREC. The driving subsection 238 thus asserts the corresponding driving signal DEREC. In this way, the actuating subsection 240 responds by closing the switching circuits coupled to the critical nodes corresponding to the erasing operation, allowing thus the discharge of such nodes through the corresponding discharge paths.

If the external voltage Vdd3_EXT becomes zero during the provision of a programming pulse (pulse indicative signal PPULSE at the high logic value), the identification subsection 236 asserts the recovery signal PREC. The driving subsection 238 thus asserts the corresponding driving signal DPREC. In this way, the actuating subsection 240 responds by closing the switching circuits coupled to the critical nodes corresponding to the programming operation, allowing thus the discharge of such nodes through the corresponding discharge paths.

Similar considerations apply in case it is the external supply voltage Vdd12_EXT that has become zero. In this case, the threshold voltage determining the switching of the enabling signal EN_V12 results to be equal to TH'=(ref)*((R1'+R2')/R2').

Reassuming, the proposed approach provides that the discharge of the critical circuit nodes of the flash memory 100 following the loss of the external supply voltages is carried out in a controlled way via a control circuit supplied with internal supply voltages generated and exploiting the electric charge accumulated during the normal operation of the device in circuit nodes having a relatively high associated capacity.

Naturally, to satisfy local and specific requirements, a person skilled in the art may apply to the approach described above many modifications and alterations.

Although in the illustrated embodiment the internal supply voltages are generated exploiting the electric charge accumulated at the circuit node of the boosting section that provides the reading voltage, the proposed approach may be also applied exploiting other nodes having a high capacity, such as for example the circuit node of the boosting section providing the biasing voltage to be provided to the bitlines.

Moreover, although reference have been explicitly made to a flash memory device having a NOR architecture, the concepts of the present invention apply to other memory devices, such as for example a flash memory device having a NAND architecture.

Similar considerations apply in case the memory device is supplied by a different number of external supply voltages (even only one).

That which is claimed:

1. A nonvolatile memory device integrated in a semiconductor material chip, the memory device configured to be supplied via at least one external supply voltage, the memory device comprising:
    a plurality of circuit nodes;
    a plurality of discharge terminals;
    a discharge circuit configured to selectively couple circuit nodes to respective discharge terminals through corresponding discharge paths;
    an accumulation device configured to accumulate electric charge;
    a driving circuit configured to drive the discharge circuit to couple at least some of the circuit nodes to the discharge terminals if the value of the at least one external supply voltage falls below a corresponding threshold;
    a supply circuit configured to supply the driving circuit with a respective intermediate supply voltage for the at least one external supply voltage;
    each intermediate supply voltage being defined by the corresponding external supply voltage when the value of the external supply voltage is higher than the corresponding threshold, and defined by an internal supply voltage locally generated by the supply circuit based upon the electric charge stored by the accumulation device when the value of the corresponding external supply voltage is lower than the corresponding threshold; and
    a generating circuit coupled to the accumulation device and configured to generate the internal supply voltage when the value of the external supply voltage is lower than the threshold, wherein said generating circuit comprises a regulation transistor having a control terminal, and an amplifier having a supply terminal coupled to the accumulation device and having an output terminal coupled to the control terminal of the regulation transistor, the regulation transistor having a first conduction terminal coupled to the accumulation device and a second conduction terminal defining an output terminal.

2. The memory device of claim 1, wherein the supply circuit comprises, for each external supply voltage, a corresponding generating subsection comprising:
    an input terminal configured to receive the external supply voltage;
    an output terminal configured to provide the corresponding intermediate supply voltage to the driving circuit;
    a monitoring circuit configured to monitor the value of the external supply voltage; and
    a switching circuit configured to couple and decouple the input terminal with the output terminal when the value of the external supply voltage is higher and lower than the threshold, respectively.

3. The memory device of claim 1, wherein said generating circuit comprises a feedback network coupled between an inverting terminal of the amplifier and the output terminal, the amplifier further including a non-inverting input terminal biased to a reference voltage.

4. The memory device of claim 3, wherein said threshold voltage is based upon the reference voltage and the feedback network.

5. The memory device of claim 1, wherein said amplifier defines part of said monitoring circuit.

6. The memory device of claim 1, further comprising a charge pump configured to generate operative voltages based upon the at least one external supply voltage, said accumulation device being defined by an output terminal of said charge pump.

7. A nonvolatile memory device comprising:
    a plurality of circuit nodes;
    a plurality of discharge terminals;
    a discharge circuit configured to selectively couple circuit nodes to respective discharge terminals through corresponding discharge paths;
    an accumulation device configured to accumulate electric charge;
    a driving circuit configured to drive the discharge circuit to couple at least some of the circuit nodes to the discharge terminals based upon the value of an external supply voltage; and
    a supply circuit configured to supply the driving circuit with a respective intermediate supply voltage defined by one of the external supply voltage and an internal supply voltage based upon the electric charge stored by the accumulation device; and a generating circuit coupled to the accumulation device and configured to generate the internal supply voltage based upon a value of the external supply voltage, wherein said generating circuit comprises a regulation transistor having a control terminal, and an amplifier having a supply terminal coupled to the accumulation device and having an output terminal coupled to the control terminal of the regulation transistor, the regulation transistor having a first conduction terminal coupled to the accumulation device and a second conduction terminal defining an output terminal.

8. The memory device of claim 7, wherein the supply circuit comprises a generating circuit comprising:

an input terminal configured to receive the external supply voltage;

an output terminal configured to provide the intermediate supply voltage to the driving circuit;

a monitoring circuit configured to monitor the value of the external supply voltage; and a switching circuit configured to couple/decouple the input terminal with the output terminal based upon the value of the external supply voltage.

9. The memory device of claim 8, wherein said generating circuit comprises a feedback network coupled between an inverting terminal of the amplifier and the output terminal, the amplifier further including a non-inverting input terminal biased to a reference voltage.

10. The memory device of claim 7, further comprising a charge pump configured to generate operative voltages based upon the external supply voltage, said accumulation device being defined by an output terminal of said charge pump.

11. A method for operating a nonvolatile memory device, the method comprising:

supplying the memory device with an external supply voltage;

selectively coupling circuit nodes of the memory device to respective discharge terminals through corresponding discharge paths via a discharge circuit;

driving the discharge circuit to couple at least some circuit nodes to the discharge terminals based upon the value of the external supply voltage;

supplying the driving circuit with an intermediate supply voltage defined by one of the corresponding external supply voltage and an internal voltage locally generated by utilizing an electric charge accumulated in the memory device based upon the value of the external supply voltage; and generating operative voltages with a charge pump based upon the external supply voltage, wherein an accumulation device is defined by an output terminal of the charge pump.

12. The method of claim 11, wherein supplying comprises the use of a generating circuit comprising:

an input terminal configured to receive the external supply voltage;

an output terminal configured to provide the intermediate supply voltage;

a monitoring circuit configured to monitor the value of the external supply voltage;

a switching circuit configured to couple and decouple the input terminal with the output terminal based upon the value of the external supply voltage; and a generating circuit coupled to the accumulation device and configured to generate the internal supply voltage based upon the value of the external supply voltage.

13. The method of claim 12, wherein said generating circuit comprises a regulation transistor configured to provide the accumulated charge based upon the value of the external supply voltage.

14. A memory device comprising:

a plurality of circuit nodes;

a plurality of discharge terminals;

a discharge circuit configured to selectively couple circuit nodes to respective discharge terminals through corresponding discharge paths;

a charge pump configured to generate operative voltages based upon an external supply voltage, said charge pump having an output defining an accumulation device to accumulate electric charge;

a driving circuit configured to drive the discharge circuit to couple at least some of the circuit nodes to the discharge terminals based upon the value of an external supply voltage; and a supply circuit configured to supply the driving circuit with a respective intermediate supply voltage defined by one of the external supply voltage and an internal supply voltage based upon the electric charge stored by the accumulation device.

15. The memory device of claim 14, further comprising a generating circuit coupled to the accumulation device and configured to generate the internal supply voltage based upon a value of the external supply voltage.

16. The memory device of claim 15, wherein said generating circuit comprises a regulation transistor having a control terminal, and an amplifier having a supply terminal coupled to the accumulation device and having an output terminal coupled to the control terminal of the regulation transistor.

* * * * *